United States Patent [19]
Lin

[11] Patent Number: 5,651,688
[45] Date of Patent: Jul. 29, 1997

[54] APPARATUS FOR MOUNTING CPU HEAT DISSIPATOR

[76] Inventor: Chuen-Sheng Lin, No. 31 Sec. 1, Min Yi Road, Wu-Ku Hsiang, Taipei Hsien, Taiwan

[21] Appl. No.: 575,243

[22] Filed: Dec. 20, 1995

[51] Int. Cl.[6] .................................................. H01R 13/62
[52] U.S. Cl. .................................... 439/331; 361/709
[58] Field of Search .............................. 439/330, 331, 439/487; 361/704, 707, 709, 710, 717, 718, 719

[56] References Cited

U.S. PATENT DOCUMENTS

| | | | |
|---|---|---|---|
| 5,208,731 | 5/1993 | Blomquist | 361/709 |
| 5,241,453 | 8/1993 | Bright et al. | 439/331 |
| 5,436,798 | 7/1995 | Wieland, Jr. | 361/710 |
| 5,486,981 | 1/1996 | Blomquist | 361/710 |

*Primary Examiner*—Khiem Nguyen
*Assistant Examiner*—Yong Kim
*Attorney, Agent, or Firm*—Browdy and Neimark

[57] ABSTRACT

The present invention is to provide a heat dissipator mounting apparatus having a rigid plate, a pressing plate and a snapping plate wherein; both the rigid plate and the pressing plate are bent upward, hence providing a resilient force. One side of the rigid plate is provided with an opening and the other side a downward bending inclined surface; one side of the pressing plate is provided with a downward bending inclined surface and the other side with a positioning recess; a plane surface formed on top of the snapping plate is provided as the applied place where external force applies, whose both sides are provided with a recess for connecting with the positioning recess of the snapping plate. Consequently, using the upward resilience of the pressing plate, the heat dissipator and the CPU are thus firmly connected together.

9 Claims, 5 Drawing Sheets

APPARATUS FOR MOUNTING CPU HEAT DISSIPATOR

FIELD OF THE INVENTION

The present invention relates generally to an apparatus for mounting CPU heat dissipator and in particular to a CPU heat dissipator mounting apparatus comprising a rigid plate, a pressing plate and a snapping plate, by which the heat dissipator and the CPU can be easily fixed onto a ZIF (zero insert force) socket to fulfill the purpose of heat dissipation and easy assembly.

BACKGROUND OF THE INVENTION

As shown in FIG. 1, which shows a prior art of the CPU heat dissipator hook up apparatus used on the ZIF socket (Taiwan Patent publication No. 246982). Both sides of the arm 1 are bent upward to provide the arm with a resilient means for increasing the assembling force with the other elements, and a holding portion 11 is formed downward at each end of the arm 1. A hole 12 is provided at the bottom of the holding portion 11 and two lugs 13 disposed upward at the opposite sides of the holding portion 11 are for the purpose of easier holding and moving. When assembled, the two lugs 13 are pressed toward the center of the arm 1 to allow the hole 12 of each of the holding portions 11 to be hooked with a bark 21 provided on the ZIF socket 2. The upward resilience of the arm 1 fixes a heat dissipator 4 on the CPU 3. When disassembled, again the two lugs 13 are pressed toward the center of the arm 1 and a force pressing the lugs 13 downward is also needed to allow the hole 12 of the holding portion 11 to disengagement from the bark 21 on the ZIF socket 2. After the above procedure is accomplished, the heat dissipator 4 is able to get off the CPU 3.

Above-mentioned prior technique suffers a major drawback which is that when the two lugs 13 are pressed toward the center of the arm 1, an extra space is needed for the operation of the lengthening arm 1 and besides that, the lugs 13 of the holding portions 11 generally are not easy to be pressed downward. Therefore, this kind of design is not comfortable for the user, especially when frequently assembling and disassembling is required.

SUMMARY OF THE INVENTION

Therefore, to provide an effective apparatus for mounting a CPU heat dissipator, the main objective of the present invention is to provide a heat dissipator mounting apparatus having a rigid plate, a pressing plate and a snapping plate. One part of both the rigid plate and the pressing plate is bent upward through an angle and at the end of this part, it is reversely bent inward, hence providing an inclined surface. The other part of the rigid plate and the pressing plate is formed respectively with a hole and two positioning recesses. A plane surface is provided on top of the snapping plate for being the place where the required downward force for assembling and disassembling is applied and on the opposite sides of the snapping plate, where there is provided with two recesses for engaging with the positioning recesses of the pressing plate. A hole is formed at the bottom of the snapping plate. With all the structure and the characteristics, the heat dissipator and the CPU can be tightly engaged together and thus accomplish the purpose of heat dissipation and easy assembling and disassembling.

Another objective of the present invention is to provide a non-fined area in the heat dissipator, where there is provided with a plurality of slots corresponding to the width of the fin of the heat dissipator. Both rows of the fins adjacent to the non-fined area are provided with projections toward the center of the non-fined area forming a insertion track for the insertion of the rigid plate and the pressing plate, therefore each of the inclined surface of the rigid plate and the pressing plate is able to be fixed by the slot within the heat dissipator, and each of the hole of both the rigid plate and the pressing plate is able to be hooked with the bark disposed on the opposite side of the ZIF socket.

Still another objective of the present invention is to provide a metal-made mounting apparatus which facilitates the heat dissipation of the CPU and also can be considered as an auxiliary heat dissipator.

The extended objective, advantages and features of the present invention will become apparent from the following description and the appended claims, taken in conjunction with the accompanying drawings.

BRIEF DESCRIPTION OF THE DRAWING

The present invention will be better understood from the following description of preferred embodiments of the present invention, with reference to the attached drawings, wherein.

DETAILED DESCRIPTION OF THE PREFERRED EMBODIMENTS

Figure 1:
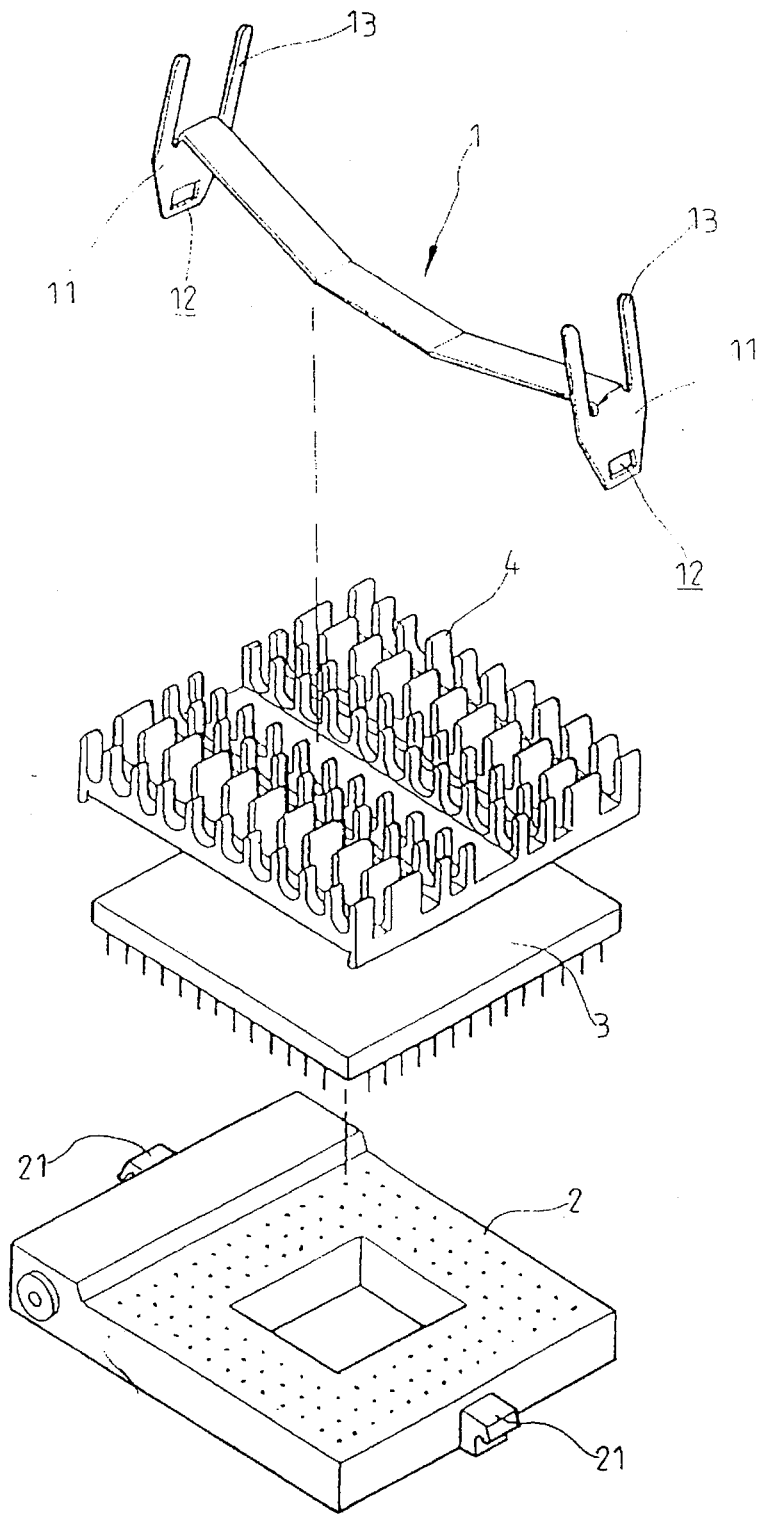
FIG. 1 is an exploded view of the prior art heat dissipator mounting apparatus applied on the ZIF socket.
Figure 2:
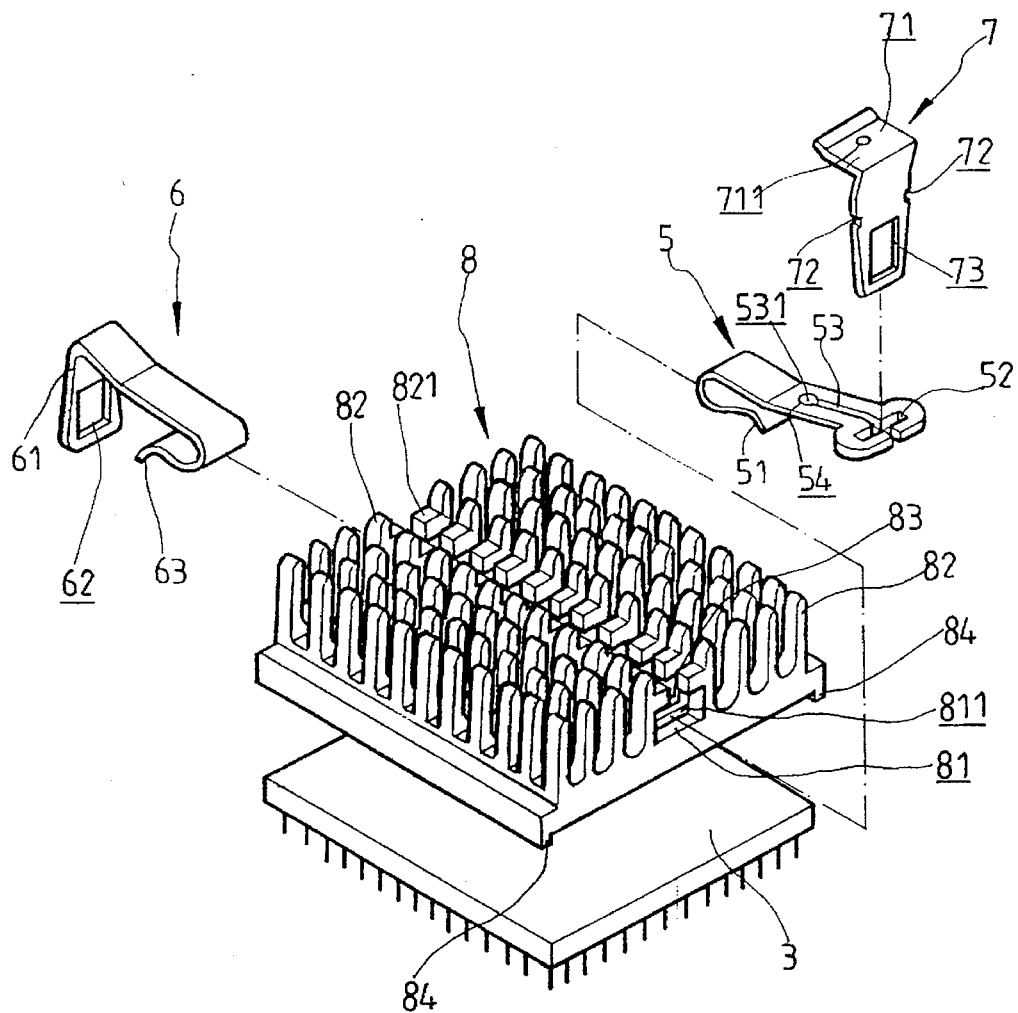
FIG. 2 is an exploded view of the present invention showing the detail features of the heat dissipator mounting apparatus.
Figure 2:
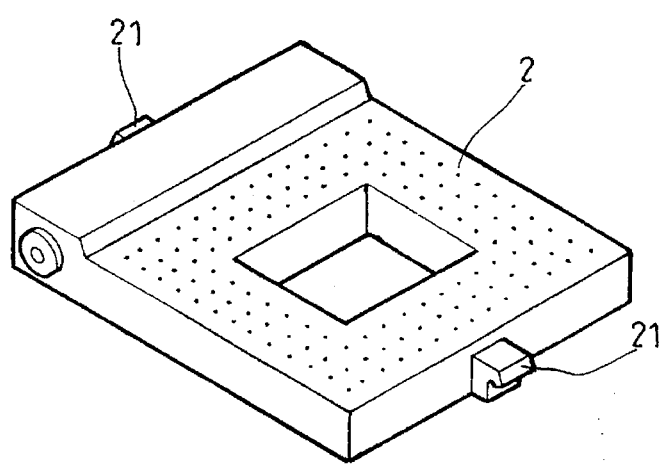

With reference to the drawings and in particular FIGS. 2–7, wherein a mounting apparatus constructed in accordance with the present invention is shown, the apparatus has a rigid plate 6, a pressing plate 5 and a snapping plate 7. One part of both the rigid plate 6 and the pressing plate 5 is bent upward with an angle and at the other end of the rigid plate 6, it is reversely bent inward, hence providing an inclined surface 63 there. The other part of the side plate 61 of the rigid plate 6 is bent downward through an angle with a hole 62 thereon for engaging a bark 21 formed on the ZIF socket 2. As to the pressing plate 5, at the end of the upward bending part, it is reversely bent inward for providing an inclined surface 51. A slot 53 is provided at the center of the pressing plate 5 to extend from an annular opening 53 to a positioning recess 52 to be used to provide a recovering force for preventing the deformation of the pressing plate 5 when the snapping plate 7 is inserted into the positioning recess 52.

A plane surface 71 provided on top of the snapping plate 7 is for the place where external force applies when combining with other elements (for example: the ZIF socket), and a hole 711 provided therein is for the place where small hand tools applies. Both sides of the snapping plate 7 are provided with a recess 72 for tightly engaging with the positioning recess 52 of the pressing plate 5. At the bottom of the snapping plate 7, an opening 73 is formed for hooking up with the bark 21 of the ZIF socket 2.

Figure 3:
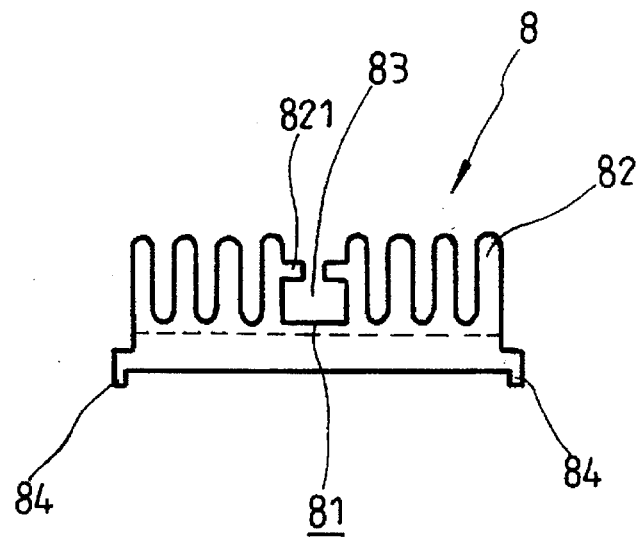
FIG. 3 is a cross-sectional view of the present invention showing that all the plates are assembled together by the mounting apparatus.

Referring to FIG. 3, a non-fined area 81 having a plurality of slots 811 corresponding to the width of the fin 82 are formed within the heat dissipator 8. Fins 82 which are located adjacent to the non-fined area 81 have projections toward the center of the non-fined area 81 forming an insertion track 83 for both the rigid plate 6 and the pressing plate 5. Positioning strip 84 preventing the CPU 3 from sliding is respectively formed downward on the side of the bottom of the heat dissipator 8, when the CPU 3 is disposed under the heat dissipator 8.

Figure 5:
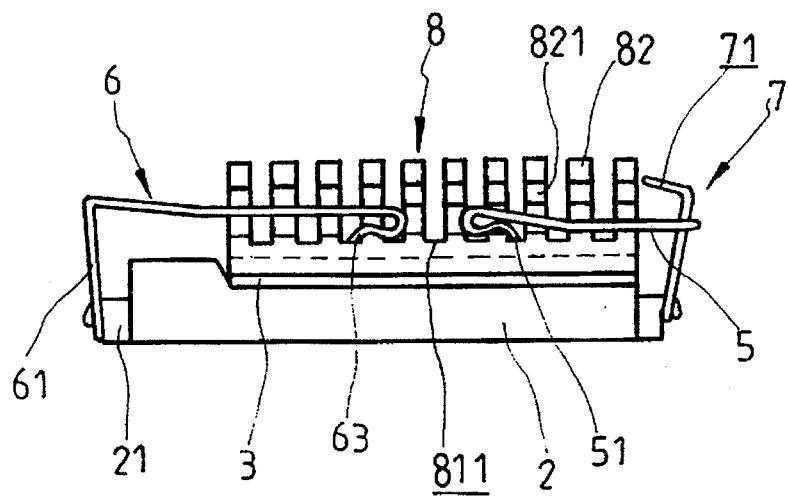
FIG. 5 is the cross-sectional view of FIG. 4.
Figure 4:
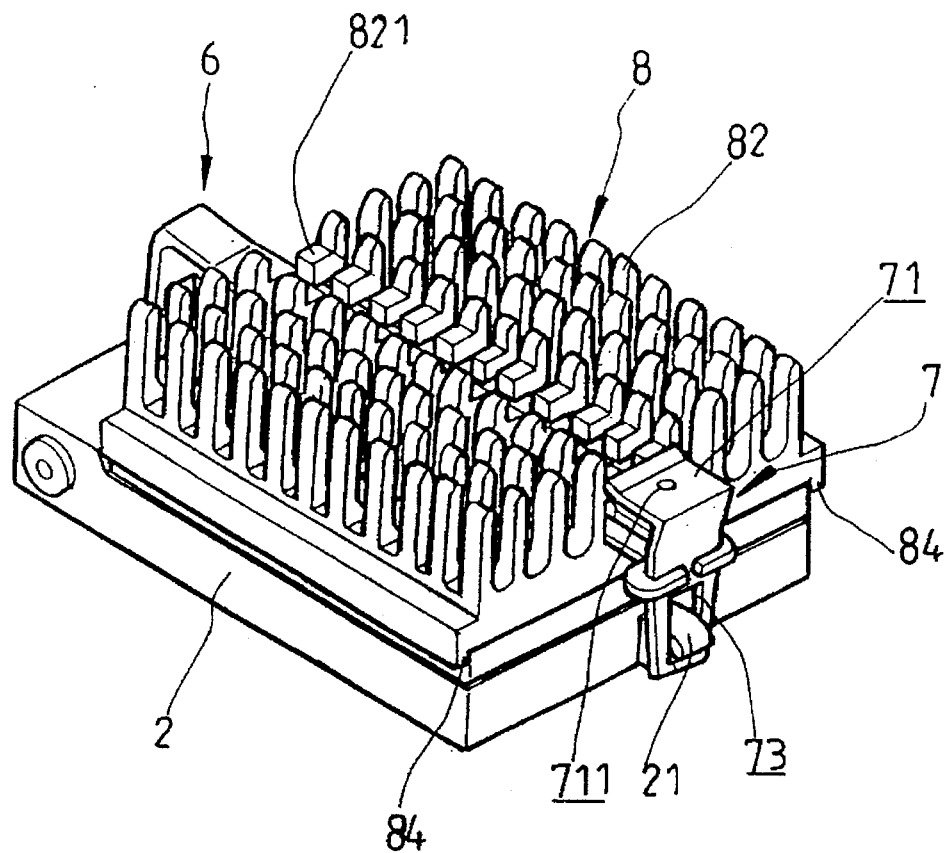
FIG. 4 is the assembly of FIG. 2.

Referring to FIG. 4, which shows the accomplished combination of all the elements, in installing the rigid plate 6, it is first to insert the bending part of the rigid plate 6 into one side of the insertion track 83 of the heat dissipator 8 and the inclined surface 63 of the rigid plate 6 is fixed onto one of a plurality of slots 811 within the non-fined area 81 of the heat dissipator 8. Because of the continuous downward pressure, consequently, the hole 62 of the rigid plate 6 is hooked with the bark 21 of the ZIF socket 2 (as shown in FIG. 5). In installing the pressing plate 5, it is first to insert the recess 72 of the snapping plate 7 into the positioning recess 52 of the pressing plate 5 to form a complete hook-up means allowing the snapping plate 7 to turn an angle with the help of the recess 72, then insert the bending part of the pressing plate 5 into another side of the insertion track 83 of the heat dissipator 8 and the inclined surface 51 of the pressing plate 5 is fixed onto one of a plurality of slots 811 within the non-fined area 81 of the heat dissipator 8. Because of the continuous downward pressure, consequently, the opening 73 of the snapping plate 7 is hooked with the bark 21 of the ZIF socket 2 (as shown in FIG. 5).

Figure 6:
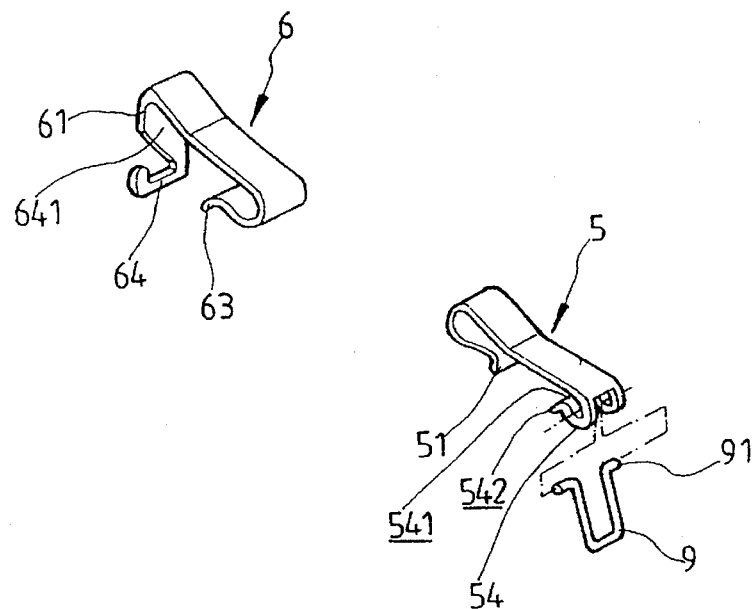
FIG. 6 is an exploded view of an embodiment of the present invention.

Referring to FIG. 6, which is an exploded view of another embodiment of the present invention. The hole 62 of the rigid plate 6 can be an L-typed bark 64. A triangular supporter 641 is provided on the side of the L-typed bark 64 for structural strengthening. If the surroundings of CPU provides enough space, it is able to directly hook the bark 21 of the ZIF socket 2 with the bark 641 and if there is no enough space left in the mother board of the computer, it is able to fix the L-typed bark 641 with the bark 21 of the ZIF socket 2 through rotating the bark 641 for an angle by the side of the bark 21 of the ZIF socket 2. The shape of the positioning recess 52 of the pressing plate 5 can also be like that of a holder 54 as shown in the figure. An opening 541 is formed at the end of the holder 54 and the bottom of the pressing plate 5, and an arc surface 542 is provided at the opening 541 of the holder 54. The snapping plate 7 can also be replaced with a U-shaped ring 9. A projector 91 is provided at the opening of the ring 9 to connect with the holder 54 of the pressing plate 5 and to hook with another side of the bark 21 of the ZIF socket 2. The width of the ring tapers downward and is slightly wider than that of the bark 21.

The projector 91 of the U-shaped ring 9 is disposed between the opening 541 and the holder 54 of the pressing plate 5, and is hooked into the holder 54 along the inclined surface 542 forming a complete hook-up means.

Figure 7:
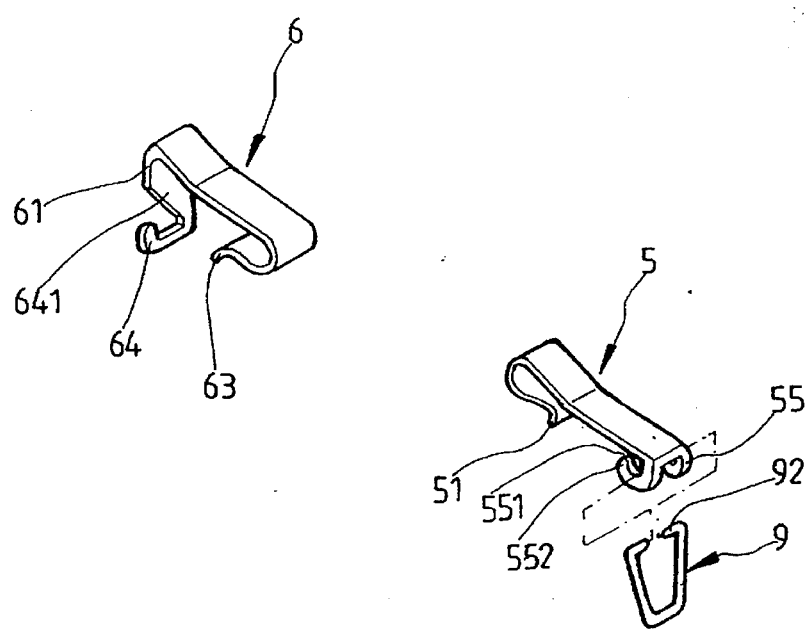
FIG. 7 is an exploded view of a further embodiment of the present invention.

As shown in FIG. 7, which is an exploded view of a further embodiment of the present invention. The appearance or the function of the rigid plate 6 is the same as that shown in FIG. 6. Yet, both sides of one end of the pressing plate 5 are provided with a hooking part 55 which is bent inwardly. An inclined opening 551 tapered inward is formed between the hooking part 55 and the pressing plate 5. Because the projector 92 of the ring 9 extends inwardly from the opening, and because of the inclination of the opening 551, inserting the projector 92 of the ring 9 into the opening 551 can be firmly fixed, such that the heat dissipator 8 can be tightly engage with the ZIF socket 2.

It is apparent that although the invention has been described in connection with the embodiment as a CPU heat dissipator mounting apparatus, it is contemplated that those skilled in the art may make changes to the preferred embodiment without departing from the scope of the invention as defined in the appended claims and can apply the same technique to the mounting apparatus, especially the apparatus having one hole at one end and a snap ring at the other for combining CPU and the heat dissipator board together to serve versified functions, other uses.

What is claimed is:

1. An apparatus for mounting a CPU heat dissipator comprising a rigid plate, a pressing plate and a snapping plate, wherein;

one part of both the rigid plate and the pressing plate is bent upward with an angle and another part of the rigid plate is reversely bent inward, hence providing an inclined surface;

another part of a side plate of the rigid plate has another part bent downward through an angle, hence providing with a hole adapted for engaging with a bark on a ZIF socket;

at one end of the upward bending part of the pressing plate, which is reversely bent inward for providing an inclined surface and an annular opening formed at one end of a slot, which is provided at the center of the pressing plate for connecting with an opening of a positioning recess are for providing a recovering force for preventing the deformation of the pressing plate when the snapping plate is inserted into the positioning recess;

a plane surface formed on top of the snapping plate is used as the place where external force applies when combined with other elements (for example: the ZIF socket), and a hole provided therein is used as the place where small hand tools applies;

both sides of the snapping plate are provided with a recess for tightly engaging with the positioning recess of the pressing plate;

at the bottom of the snapping plate, an opening is formed for hooking up with the bark of the ZIF socket;

a non-finned area having the width corresponding to that of a fin is formed within the heat dissipator which provides a plurality of projections facing the center of the non-finned area for tightly engaging with the rigid plate and the pressing plate.

2. The apparatus as claimed in claim 1, wherein both sides of the heat dissipator are provided downward with a positioning plate for preventing sliding when the CPU is mounted onto the heat dissipator.

3. The apparatus as claimed in claim 1, wherein one end of the rigid plate is shaped as an "L", and the triangular supporter formed on the side of the L-shaped end is for enhancing a hook-up force of an L-shaped bark.

4. The apparatus as claimed in claim 1, wherein one end of the pressing plate is bent reversely inward forming a holder whose end corresponds with the bottom of the pressing plate providing an opening where an arc surface of the holder is adapted for connecting with a bark of the ZIF socket by a U-shaped ring.

5. The apparatus as claimed in claim 1, wherein one end of the pressing plate is bent reversely inward forming a hooking part which corresponds with the pressing plate providing a inclined opening therebetween; an inward tapering inclined surface of the opening is formed for connecting the bark of the ZIF socket with a ring.

6. The apparatus as claimed in claim 4, wherein the projector of the ring extends outward from the opening.

7. The apparatus as claimed in claim 4, wherein the projector of the ring extends inward from the opening.

8. The apparatus as claimed in claim 5, wherein the projector of the ring extends outward from the opening.

9. The apparatus as claimed in claim 5, wherein the projector of the ring extends inward from the opening.

* * * * *